US009230686B2

(12) United States Patent
Kubouchi et al.

(10) Patent No.: US 9,230,686 B2
(45) Date of Patent: Jan. 5, 2016

(54) SEMICONDUCTOR DEVICE HAVING ROLL CALL CIRCUIT

(71) Applicant: Micron Technology, Inc., Boise, ID (US)

(72) Inventors: Shuichi Kubouchi, Tokyo (JP); Hiroyuki Yamamoto, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/223,911

(22) Filed: Mar. 24, 2014

(65) Prior Publication Data

US 2014/0286113 A1 Sep. 25, 2014

(30) Foreign Application Priority Data

Mar. 25, 2013 (JP) ................................. 2013-061704

(51) Int. Cl.
*G11C 29/00* (2006.01)
*G11C 29/08* (2006.01)
*G11C 29/34* (2006.01)
*G11C 29/26* (2006.01)

(52) U.S. Cl.
CPC ................ *G11C 29/08* (2013.01); *G11C 29/34* (2013.01); *G11C 2029/2602* (2013.01)

(58) Field of Classification Search
CPC ................ G11C 11/408; G11C 17/16; G11C 2029/2602; G11C 29/08; G11C 29/34
See application file for complete search history.

(56) References Cited

U.S. PATENT DOCUMENTS

| 3,427,587 | A | * | 2/1969 | Robinson et al. ............ 340/10.4 |
| 4,984,205 | A | * | 1/1991 | Sugibayashi ................. 365/200 |
| 5,124,949 | A | * | 6/1992 | Morigami ................ 365/189.14 |
| 5,517,458 | A | * | 5/1996 | Koshikawa .............. 365/230.06 |
| 5,892,718 | A | * | 4/1999 | Yamada ........................ 365/200 |
| 2003/0107931 | A1 | * | 6/2003 | Dono ............................ 365/201 |

FOREIGN PATENT DOCUMENTS

JP 05-047196 2/1993

* cited by examiner

*Primary Examiner* — Tuan T Nguyen
*Assistant Examiner* — Uyen B Tran
(74) *Attorney, Agent, or Firm* — Dorsey & Whitney LLP (57) ABSTRACT

Disclosed herein is an apparatus that includes: a plurality of memory banks each including a plurality of memory cells; a plurality of redundant circuits each allocated to an associated one of the plurality of memory banks to replace a defective memory cell among the plurality of memory cells included in the associated memory bank; a plurality of roll call circuits allocated to an associated one of the plurality of memory banks to generate a roll call data when an address corresponding to the defective memory cell is supplied; and a plurality of data buses commonly allocated to the plurality of memory banks. The roll call circuits output the roll call data to the plurality of data buses in parallel.

7 Claims, 7 Drawing Sheets

| BANK | X15 | RWBS |
|---|---|---|
| 0 | L | 0 |
| 0 | H | 1 |
| 1 | L | 4 |
| 1 | H | 5 |
| 2 | L | 8 |
| 2 | H | 9 |
| 3 | L | 12 |
| 3 | H | 13 |
| 4 | L | 16 |
| 4 | H | 17 |
| 5 | L | 20 |
| 5 | H | 21 |
| 6 | L | 24 |
| 6 | H | 25 |
| 7 | L | 28 |
| 7 | H | 29 |

FIG.4

| OPERATION MODE | TM1 | TM2 | TM3 |
|---|---|---|---|
| 1 | L | H | L |
| 2 | L | - | H |
| 3 | H | L | L |
| 4 | L | L | L |

SEMICONDUCTOR DEVICE HAVING ROLL CALL CIRCUIT

BACKGROUND

1. Field of the Invention

Embodiments of the present invention relate to a semiconductor device, and more particularly relates to a semiconductor device including a roll call circuit.

2. Description of Related Art

A semiconductor memory device such as a DRAM (Dynamic Random Access Memory) generally includes a large number of memory cells, and thus it is hard to manufacture the device with all the memory cells working properly. For this reason, most semiconductor memory devices include a redundant circuit for replacing a defective memory cell. When an access request to the defective memory cell is issued, the semiconductor memory device performs an access to the redundant circuit instead of performing the access to the defective memory cell. This enables access to a memory address corresponding to the defective memory cell, so that a user can handle it as a semiconductor memory device with no defect.

Meanwhile, from a viewpoint of a device designer, there is a demand to check whether each address is replaced by the redundant circuit by a test operation. To meet this demand, a roll call circuit is often provided (see Japanese Patent Application Laid-Open No. H05-47196).

A semiconductor device described in Japanese Patent Application Laid-Open No. H05-47196 includes a plurality of memory arrays. When performing a roll call test, the same address is supplied to the memory arrays, so that the roll call test is performed in parallel for the plurality of memory cell arrays.

However, the semiconductor device described in Japanese Patent Application Laid-Open No. H05-47196 masks roll call data obtained in parallel from the plurality of memory arrays except for selected roll call data, by which the selected roll call data is output to outside. Therefore, it is equivalent to conduct the roll call test for substantially a single memory cell, and thus it takes a long time to complete the roll call test for all addresses.

SUMMARY

In one embodiment, there is provided a semiconductor device that includes: a plurality of memory banks each including a plurality of memory cells; a plurality of redundant circuits each allocated to an associated one of the memory banks to replace a defective memory cell among the plurality of memory cells included in the memory bank; a plurality of roll call circuits allocated to an associated one of the memory banks to generate a roll call data when an address corresponding to the defective memory cell is supplied; and a plurality of data buses commonly allocated to the memory banks, wherein the roll call circuits output the roll call data to the data buses in parallel.

According to the embodiment of the present invention, the roll call data output from a plurality of roll call circuits respectively allocated to a plurality of memory banks are output to data buses in parallel, and thus a time required for a roll call test can be greatly reduced.

DETAILED DESCRIPTION OF THE EMBODIMENTS

Embodiments of the present invention will be explained below in detail with reference to the accompanying drawings.

Figure 1:
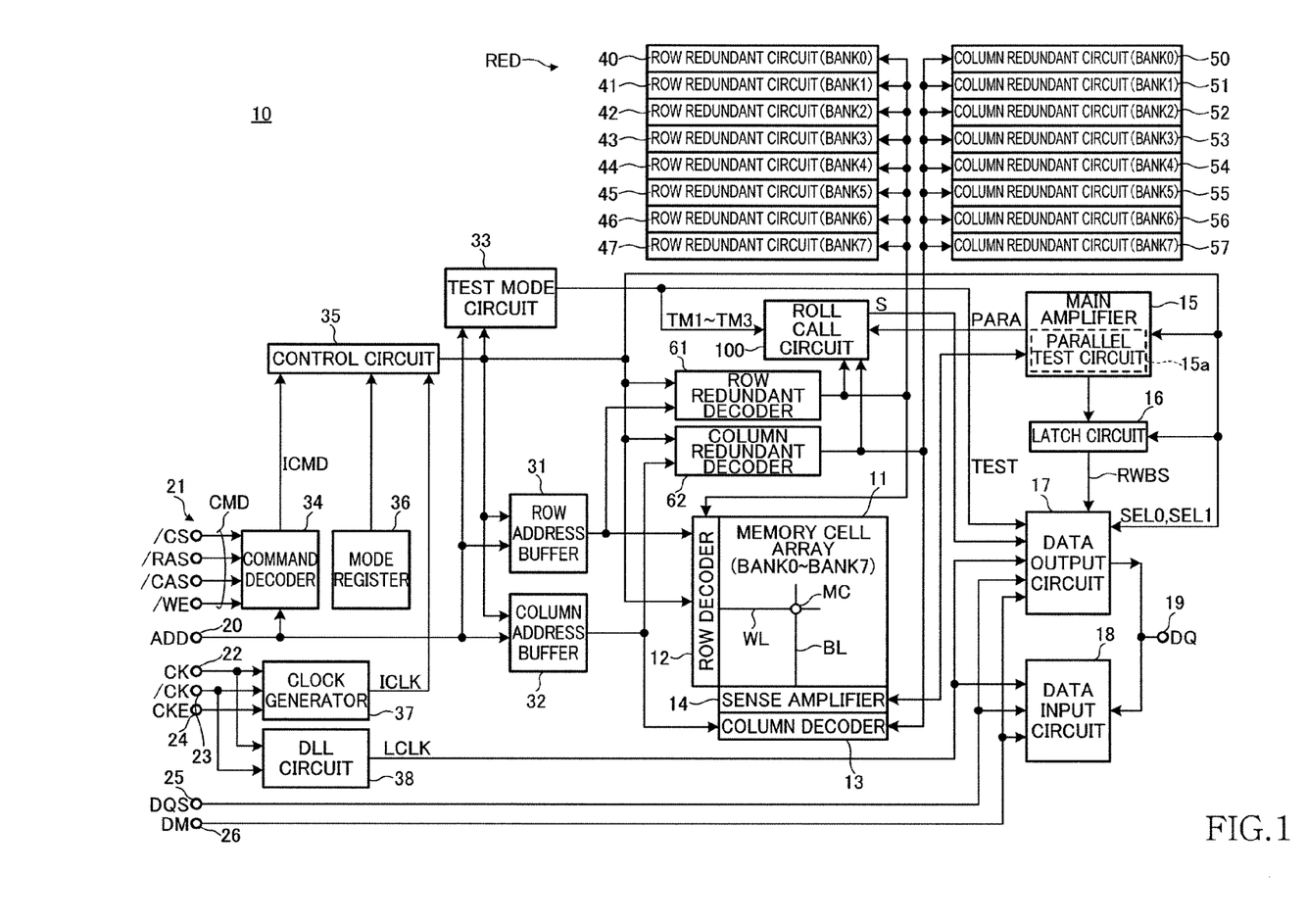
FIG. 1 is a block diagram showing a semiconductor device according to an embodiment of the present invention.

Referring now to FIG. 1, an apparatus includes a semiconductor device 10 according to an embodiment of the present invention. As used herein, apparatus may refer to, for example, an integrated circuit, a memory device, a memory system, an electronic device or system, a smart phone, a tablet, a computer, a server, etc. The semiconductor device 10 includes a memory cell array 11 that is divided into a plurality of memory banks BANK0 to BANK7. A memory bank is a unit that can independently execute a command, and basically a non-exclusive operation can be performed between the memory banks.

The memory cell array 11 includes a plurality of word lines WL and a plurality of bit lines BL intersecting with each other and a memory cell MC is arranged at each interaction thereof. A selection of the word line WL is performed by a row decoder 12, and a selection of the bit line BL is performed by a column decoder 13. The bit line BL is connected to a sense amplifier 14. The bit line BL selected by the column decoder 13 is connected to a main amplifier 15 via the sense amplifier 14. The main amplifier 15 is connected to a data output circuit 17 and a data input circuit 18 via a latch circuit 16. The main amplifier 15 includes a parallel test circuit 15a that generates test data PARA by compressing data read from the memory banks BANK0 to BANK7. The data output circuit 17 and the data input circuit 18 are connected to a data terminal 19, and respectively perform output of read data DQ and input of write data DQ.

The semiconductor device 10 includes address terminals 20, command terminals 21, clock terminals 22 and 23, a clock enable terminal 24, a data strobe terminal 25, a data mask terminal 26, and the like, as well as the data terminal 19.

The address terminals 20 are supplied with an address signal ADD. The address signal ADD supplied to the address terminals 20 are transferred to a row address buffer 31, a column address buffer 32, a test mode circuit 33, and the like. The row address buffer 31 is supplied with the address signal ADD at the time of a row access (at the time of issuing an active command). The address signal ADD supplied to the row address buffer 31 is transferred to the row decoder 12. The column address buffer 32 is supplied with the address signal ADD at the time of a column access (at the time of issuing a read command or a write command). The address signal ADD supplied to the column address buffer 32 is transferred to the column decoder 13.

The command terminal 21 is supplied with a command signal CMD, which includes a chip select signal /CS, a row-address strobe signal /RAS, a column-address strobe signal /CAS, a write enable signal /WE, and the like. The command signal CMD is supplied to a command decoder 34. The command decoder 34 generates an internal command signal ICMD based on the command signal CMD and outputs the internal command signal ICMD to a control circuit 35. The control circuit 35 controls each circuit block such as the row address buffer 31, the column address buffer 32, the test mode circuit 33, and the like based on the internal command signal ICMD and a set value of a mode register 36. The mode register 36 is a circuit to which a parameter, which indicates an operation mode and the like of the semiconductor device 10 according to the present embodiment, is set.

Therefore, when the active command and the read command are issued and a row address and a column address are supplied in synchronization with the active command and the read command, a set of the read data DQ is read from the memory cells MC that are designated by the row address and the column address. The set of the read data DQ is output to outside from the data terminal 19 via the main amplifier 15, the latch circuit 16, and the data output circuit 17.

Meanwhile, when the active command and the write command are issued and the row address and the column address are supplied in synchronization with the active command and the write command, and a set of the write data DQ is then input to the data terminal 19, the set of the write data DQ is supplied to the memory cell array 11 via the data input circuit 18, the latch circuit 16, and the main amplifier 15, and is written in the memory cells MC that are designated by the row address and the column address.

External clock signals CK and /CK are respectively supplied to the clock terminals 22 and 23. The external clock signals CK and /CK are complementary signals to each other, and which are supplied to a clock generator 37. The clock generator 37 generates an internal clock signal ICLK based on the external clock signals CK and /CK when a clock enable signal CKE supplied via the clock enable terminal 24 is activated. The internal clock signal ICLK is supplied to the control circuit 35 and the like.

The external clock signals CK and /CK are further supplied to a DLL circuit 38. The DLL circuit 38 generates the internal clock signal LCLK that is phase-controlled with respect to the external clock signals CK and /CK. The internal clock signal LCLK is supplied to the data output circuit 17 and the data input circuit 18, and defines apart of operation timings of the data output circuit 17 and the data input circuit 18.

A data strobe signal DQS is input to or output from the data strobe terminal 25. The data strobe terminal 25 is connected to the data output circuit 17 and the data input circuit 18. At the time of a read operation, the data strobe signal DQS is output to outside in synchronization with the read data DQ that is output from the data terminal 19. At the time of a write operation, the data strobe signal DQS is input from outside in synchronization with the write data DQ that is input to the data terminal 19.

The data mask terminal 26 is supplied with a data mask signal DM. The data mask signal DM is a signal for masking the write data DQ, and is supplied to the data input circuit 18.

The semiconductor device 10 according to the present embodiment further includes a redundant circuit RED. The redundant circuit RED includes row redundant circuits 40 to 47 that are respectively allocated to the memory banks BANK0 to BANK7 and column redundant circuits 50 to 57 that are respectively allocated to the memory banks BANK0 to BANK7.

Each of the row redundant circuits 40 to 47 includes a redundant word line (not shown). When the address signal ADD supplied at the time of the row access indicates a defective word line WL, the redundant word line is accessed by a row redundant decoder 61 in place of the defective word line WL. When performing a substitute access to any one of the row redundant circuits 40 to 47, the row redundant decoder 61 stops an operation of the row decoder 12. Similarly, each of the column redundant circuits 50 to 57 includes a redundant bit line (not shown). When the address signal ADD supplied at the time of the column access indicates a defective bit line BL, the redundant bit line is accessed by a column redundant decoder 62 in place of the defective bit line BL. When performing a substitute access to any one of the column redundant circuits 50 to 57, the column redundant decoder 62 stops an operation of the column decoder 13.

The semiconductor device 10 according to the present embodiment further includes a roll call circuit 100. Although only one block indicating the roll call circuit 100 is shown in FIG. 1, in practice, the semiconductor device 10 includes a plurality of roll call circuits respectively allocated to the memory banks BANK0 to BANK7.

An operation of the roll call circuit 100 is controlled by the test mode circuit 33. The operation of the roll call circuit 100 may include first to fourth operation modes. Although the details are described later, the first and second operation modes are operation modes in which the roll call test is performed simultaneously for all the memory banks BANK0 to BANK7, the third operation mode is an operation mode in which the roll call test is performed for any one of the memory banks BANK0 to BANK7, and the fourth operation mode is an operation mode that is selected when performing a so-called "parallel test".

Roll call data S output from the roll call circuit 100 is supplied to the data output circuit 17. The roll call data S is supplied to the data output circuit 17 via a plurality of data buses RWBS commonly allocated to the memory banks BANK0 to BANK7.

Figure 2:
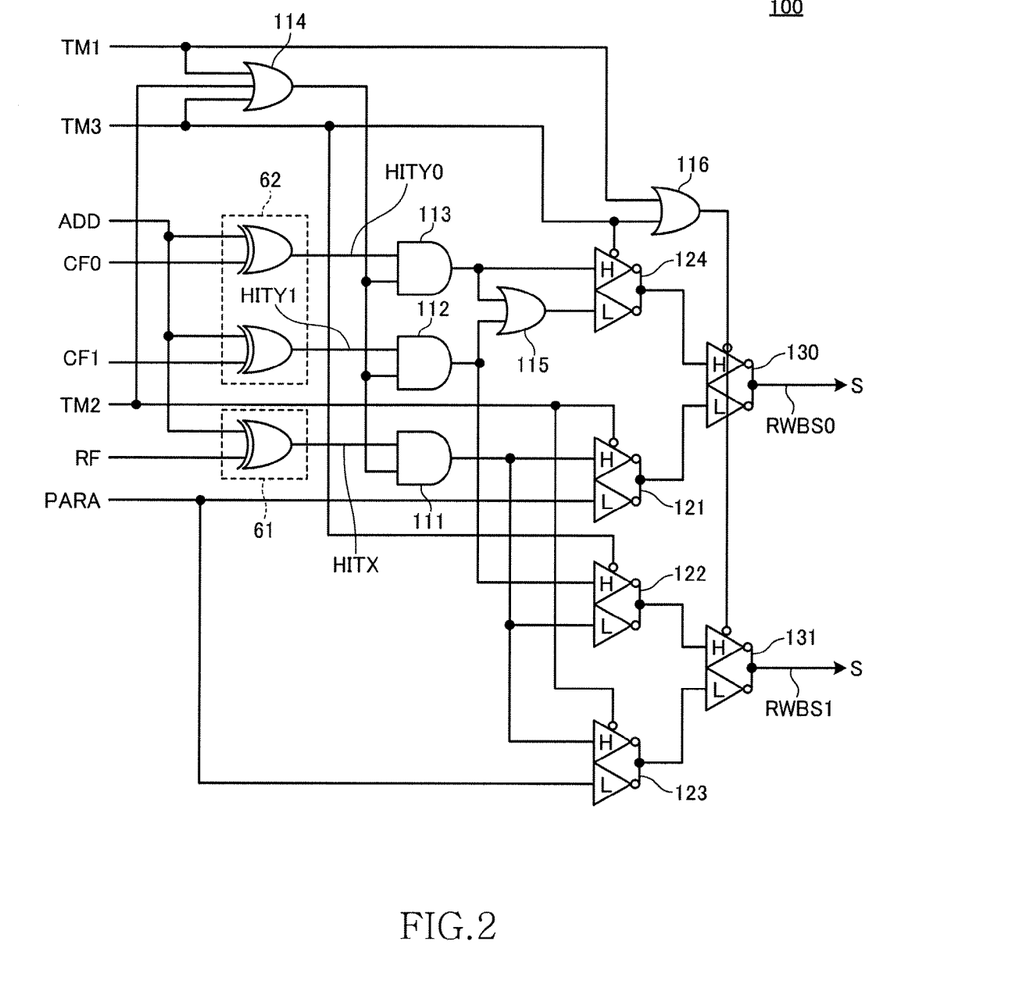
FIG. 2 is a circuit diagram of the roll call circuit shown in FIG. 1 corresponding to a memory bank BANK0 according to an embodiment of the invention.

Turning to FIG. 2, a roll call circuit 100 according to an embodiment of the invention is shown. The roll call circuit 100 corresponding to the memory bank BANK0 outputs the roll call data S of 2 bits generated based on the test mode signals TM1 to TM3, the test data PARA, and the hit signals HITX, HITY0, and HITY1 to two data buses RWBS0 and RWBS1. The semiconductor device 10 according to an embodiment includes 32 data buses RWBS0 to RWBS31 commonly allocated to the memory banks BANK0 to BANK7, and the two data buses RWBS0 and RWBS1 among the data buses are allocated to the circuit shown in FIG. 2.

Figure 3:
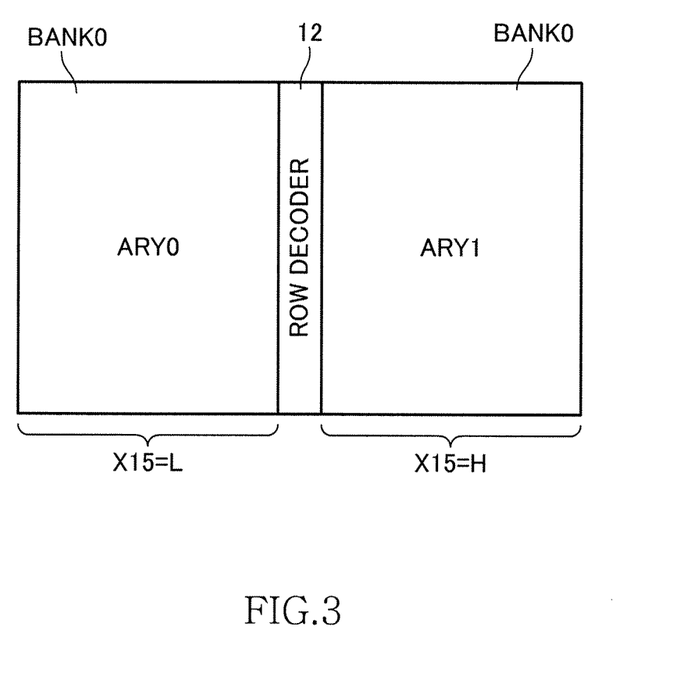
FIG. 3 is a diagram indicating a configuration of the memory bank BANK0 according to an embodiment of the invention.

The hit signal HITX is a signal generated by the row redundant decoder 61, which is activated when the address signal ADD supplied at the time of the row access indicates an address RF of a defective word line. The hit signals HITY0 and HITY1 are signals generated by the column redundant decoder 62, which are respectively activated when the address signal ADD supplied at the time of the column access indicates addresses CF0 and CF1 of a defective bit line. The reason why the hit signals HITY0 and HITY1 are divided into two at the time of the column access is, as shown in FIG. 3, because the memory bank BANK0 is divided into two areas ARY0 and ARY1. The other memory banks BANK1 to BANK7 are similar to the memory bank BANK0. Either one of the two areas ARY0 and ARY1 is selected by the most significant bit X15 of the row address, the hit signal HITY0 is activated when the bit line BL included in the area ARY0 is a defective bit line, and the hit signal HITY1 is activated when the bit line BL included in the area ARY1 is a defective bit line.

The hit signals HITX, HITY0, and HITY1 are supplied to one of input nodes of AND gate circuits 111 to 113, respectively. An output signal of an OR gate circuit 114 is commonly supplied to the other one of the input nodes of the AND gate circuits 111 to 113. The OR gate circuit 114 is a three-input gate circuit that receives the test mode signals TM1 to TM3. An output signal of the AND gate circuit 111 is supplied to a selector 130 via a selector 121, and at the same time, supplied to a selector 131 via selectors 122 and 123. Output signals of the AND gate circuits 112 and 113 are supplied to a selector 124 via an OR gate circuit 115. The output signal of the AND gate circuit 113 is further supplied to the selector 130 via the selector 124.

Each of the selectors 121 to 124, 130, and 131 is a circuit that outputs either one of signals supplied to the two input nodes, and a selection thereof is determined by a corresponding select signal. Specifically, when the corresponding select signal is a high level, a signal input to a side noted as H is selected, and when the corresponding select signal is a low level, a signal input to a side noted as L is selected. The test mode signal TM2 is used as the select signal for the selectors 121 and 123, and the test mode signal TM3 is used as the select signal for the selectors 122 and 124. An output signal of an OR gate circuit 116 that receives the test mode signals TM1 and TM3 is used as the select signal for the selectors 130 and 131.

Figure 4:
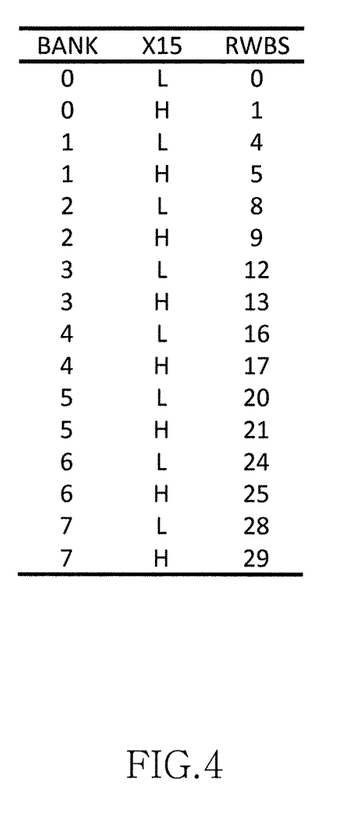
FIG. 4 is a table for explaining an output destination of a roll call data according to an embodiment of the invention.

Pieces of the roll call data S output from the selectors 130 and 131 are respectively supplied to the data buses RWBS0 and RWBS1. Although it is not shown in the drawings, the roll call circuits 100 corresponding to the other memory banks BANK1 to BANK7 have the same circuit configuration as the roll call circuit 100 shown in FIG. 2, except that output destinations of the roll call data S differ from each other. FIG. 4 is a table for explaining the output destination of the roll call data S in each of the roll call circuits 100, which shows that each roll call data S is output to a different data bus.

Figure 5:
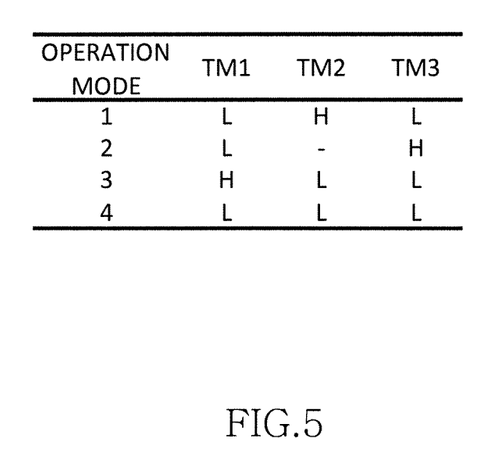
FIG. 5 is a table showing a relationship between the test mode signals TM1 to TM3 and the operation mode selected based on the test mode signals according to an embodiment of the invention.

As shown in FIG. 5, when selecting the first operation mode, the test mode signals TM1 and TM3 are set to a low level, and the test mode signal TM2 is set to a high level. The setting of the test mode signals TM1 to TM3 is performed by the test mode circuit 33 shown in FIG. 1. When the first operation mode is selected, the hit signal HITX is output to the data buses RWBS0 and RWBS1 from the roll call circuit 100 corresponding to the memory bank BANK0. Similarly, the corresponding hit signals HITX are output from the roll call circuits 100 respectively corresponding to the other memory banks BANK1 to BANK7. With this operation, the hit signals HITX (the roll call data) corresponding to the memory banks BANK0 to BANK7 are supplied to the data output circuit 17 shown in FIG. 1 in parallel via the 16 data buses.

When selecting the second operation mode, the test mode signal TM1 is set to a low level, and the test mode signal TM3 is set to a high level. The test mode signal TM2 is handled as "don't care". When the second operation mode is selected, the hit signals HITY0 and HITY1 are respectively output to the data buses RWBS0 and RWBS1 from the roll call circuit 100 corresponding to the memory bank BANK0. Similarly, the corresponding hit signals HITY0 and HITY1 are output from the roll call circuits 100 respectively corresponding to the other memory banks BANK1 to BANK7. With this operation, the hit signals HITY0 and HITY1 (the roll call data) corresponding to the memory banks BANK0 to BANK7 are supplied to the data output circuit 17 shown in FIG. 1 in parallel via the 16 data buses.

When selecting the third operation mode, the test mode signal TM1 is set to a high level, and the test mode signals TM2 and TM3 are set to a low level. When the third operation mode is selected, a logical sum signal of the hit signals HITY0 and HITY1 (an output signal of the OR gate circuit 115) and the hit signal HITX are respectively output to the data buses RWBS0 and RWBS1 as the roll call data from the roll call circuit 100 corresponding to the selected memory bank (for example, the memory bank BANK0).

When selecting the fourth operation mode, the test mode signals TM1 to TM3 are all set to a low level. When the fourth operation mode is selected, the test data PARA corresponding to the memory bank BANK0 is output to the data buses RWBS0 and RWBS1. Similarly, pieces of the test data PARA corresponding to the other memory banks BANK1 to BANK7 are also output. With this operation, the pieces of test data PARA corresponding to the memory banks BANK0 to BANK7 are supplied to the data output circuit 17 shown in FIG. 1 in parallel via the 16 data buses.

Figure 6:
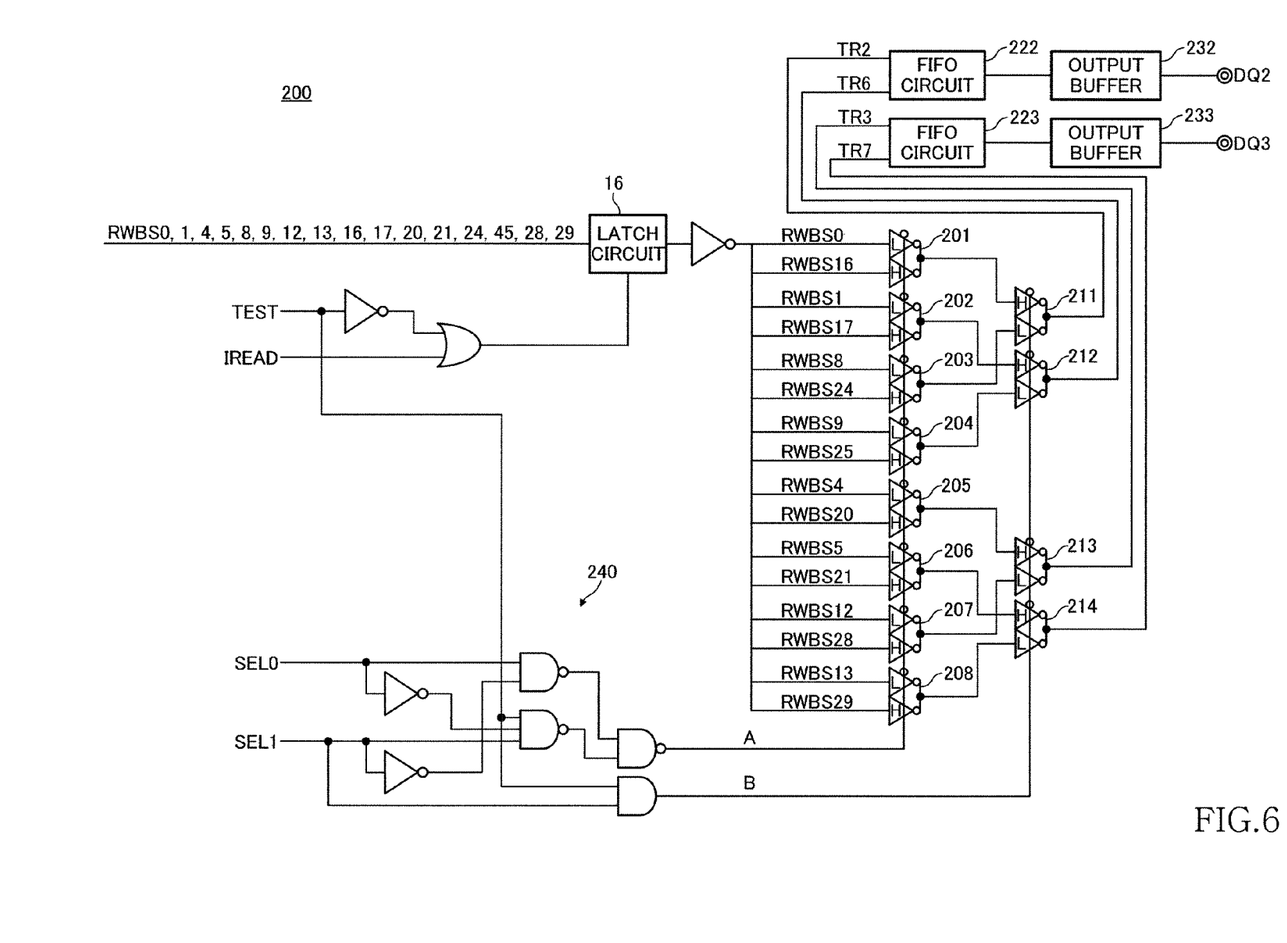
FIG. 6 is a circuit diagram of a parallel-to-serial conversion unit included in the data output circuit shown in FIG. 1 according to an embodiment of the invention.

Turning to FIG. 6, the roll call data or the test data on the 16 data buses RWBS0, RWBS1, RWBS4, RWBS5, . . . are supplied to the parallel-to-serial conversion unit 200 via the latch circuit 16. The roll call data or the test data on the 16 data buses RWBS0, RWBS1, RWBS4, RWBS5, . . . are supplied to FIFO circuits 222 and 223 via selectors 201 to 208 and 211 to 214. A select signal A is supplied to the selectors 201 to 208, and a select signal B is supplied to the selectors 211 to 214. When the corresponding select signal is a high level, a signal input to a side noted as H is selected, and when the corresponding select signal is a low level, a signal input to a side noted as L is selected. Therefore, when both the select signals A and B are the low level, the roll call data or the test data on the data buses RWBS8, RWBS12, RWBS9, and RWBS13 are respectively supplied to signal lines TR2, TR3, TR6, and TR7.

The select signals A and B are generated by a logic circuit 240 shown in FIG. 6 based on select signals SEL0 and SEL1 that are supplied from the control circuit 35. The logic circuit 240 is activated by a test signal TEST, and switches logical levels of the select signal A and B based on the select signal SEL0 and SEL1. When the test signal TEST is activated, the latch circuit 16 latches the roll call data or the test data on the data buses in synchronization with a read signal IREAD supplied from the control circuit 35.

The FIFO circuits 222 and 223 are circuits that perform serial conversion of the test data input via the signal lines TR2, TR3, TR6, and TR7 and output the serial data to output buffers 232 and 233. The output buffers 232 and 233 are respectively connected to corresponding data terminals DQ2 and DQ3. The data terminals DQ2 and DQ3 are ones of the data terminal 19, for performing output of read data DQ2 and DQ3 and input of write data DQ2 and DQ3.

Figure 7:
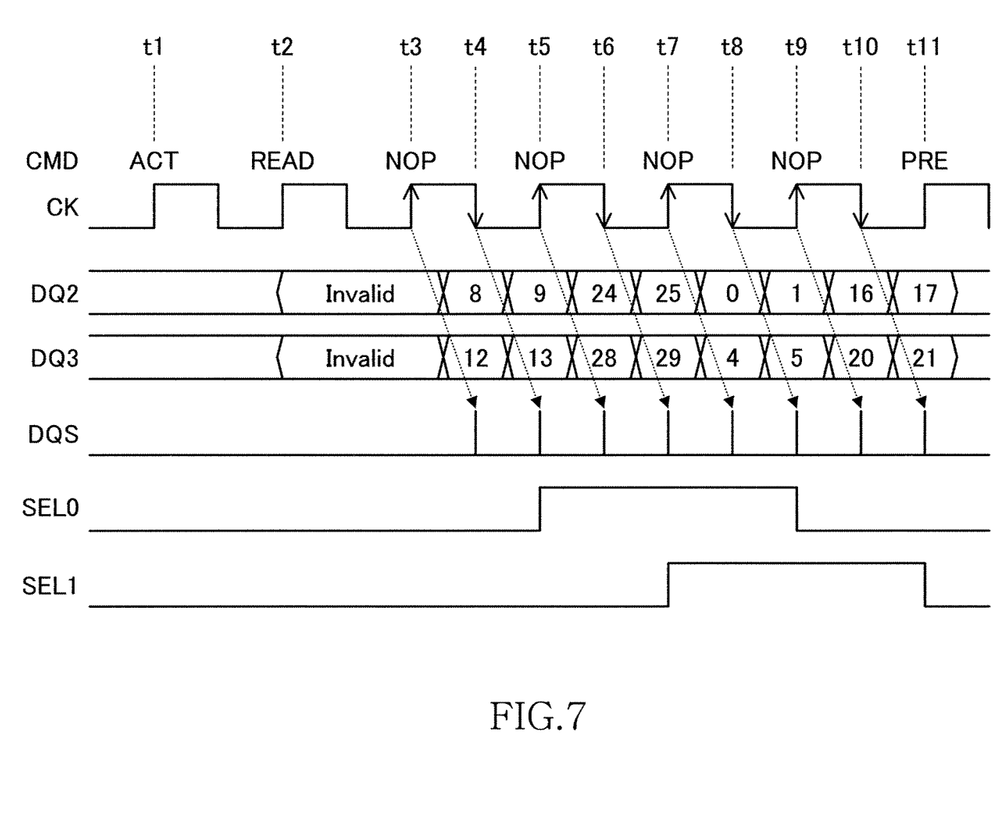
FIG. 7 is a timing chart for the parallel-to-serial conversion unit shown in FIG. 6 according to an embodiment of the invention.

In the example shown in FIG. 7, an active command ACT is issued at a time t1, and a read command READ is issued at a time t2. The semiconductor device has entered into the first or second operation mode by a test command issued prior to the time t1. With this operation, for example, in the case where the semiconductor device has entered into the first operation mode, when a predetermined address signal ADD (a row address) is input in synchronization with the active command ACT, the hit signals HITX (roll call data) corresponding to the memory banks BANK0 to BANK7 are supplied in parallel on the 16 data buses RWBS0, RWBS1, RWBS4, RWBS5, . . . . Meanwhile, in the case where the semiconductor device has entered into the second operation mode, when a predetermined address signal ADD (a column address) is input in synchronization with the read command READ, the hit signals HITY0 and HITY1 (roll call data) corresponding to the memory banks BANK0 to BANK7 are supplied in parallel on the 16 data buses RWBS0, RWBS1, RWBS4, RWBS5, . . . .

Thereafter, in synchronization with rising edges or falling edges of clock signals CK at times t3 to t10, 8 bits of the roll call data are output in serial from each of the data terminals DQ2 and DQ3. In FIG. 7, numerals noted in fields of the data terminals DQ2 and DQ3 are numbers of the selected data buses, which are selected in order by a switch of the select signals SEL0 and SEL1. Specifically, the roll call data on the data buses RWBS8, RWBS9, RWBS24, RWBS25, RWBS0, RWBS1, RWBS16, and RWBS17 are output in this order from the data terminal DQ2, and the roll call data on the data buses RWBS12, RWBS13, RWBS28, RWBS29, RWBS4, RWBS5, RWBS20, and RWBS21 are output in this order from the data terminal DQ3.

In this manner, the roll call data corresponding to the eight memory banks BANK0 to BANK7 are output in serial from the two data terminals DQ2 and DQ3. Therefore, when the semiconductor device enters into the first operation mode, the roll call data on the row addresses of the memory banks BANK0 to BANK7 can be collectively output, and when the semiconductor device enters into the second operation mode, the roll call data on the column addresses of the memory banks BANK0 to BANK7 can be collectively output.

As described above, the semiconductor device 10 according to the present embodiment performs a roll call test for a plurality of memory banks in parallel and outputs obtained roll call data to data buses in parallel, thereby eliminating the necessity of conducting the roll call test for each bank. As a result, the time required for the roll call test can be greatly reduced.

It is apparent that the present invention is not limited to the above embodiments, but may be modified and changed without departing from the scope and spirit of the invention.

For example, although the roll call data output to the data buses in parallel are output from the two data terminals DQ2 and DQ3 in the above-mentioned embodiment, this aspect is not essential in the present invention. That is, the roll call data can be output in serial from a single data terminal, or all the roll call data can be output in parallel.

What is claimed is:

1. An apparatus comprising:
a plurality of memory banks each including a plurality of memory cells;
a plurality of redundant circuits each allocated to an associated one of the plurality of memory banks to replace a defective memory cell among the plurality of memory cells included in the associated memory bank;
a plurality of roll call circuits allocated to an associated one of the plurality of memory banks to generate a roll call data when an address corresponding to the defective memory cell is supplied, each of the plurality of roll call circuits having first and second operation modes and each of the plurality of roll call circuits configured to generate when in the first operation mode the roll call data when an address corresponding to a defective word line included the memory bank is supplied and configured to generate when in the second operation mode the roll call data when an address corresponding to a defective bit line included the memory bank is supplied; and
a plurality of data buses commonly allocated to the plurality of memory banks,
wherein the plurality of roll call circuits output the roll call data to the plurality of data buses in parallel.

2. The apparatus as claimed in claim 1, further comprising:
a data terminal; and
a data output circuit connected between the plurality of data buses and the data terminal,
wherein the data output circuit performs serial conversion of the roll call data supplied in parallel via the plurality of data buses and outputs the serial data to the data terminal.

3. The apparatus as claimed in claim 1, wherein
each of the plurality of memory banks includes a plurality of word lines and a plurality of bit lines for selecting the plurality of memory cells,
each of the plurality of redundant circuits includes:
a row redundant circuit that replaces a defective word line among the plurality of word lines included in the memory bank; and
a column redundant circuit that replaces a defective bit line among the plurality of bit lines included in the memory bank, and
each of the plurality of roll call circuits generates the roll call data when an address corresponding to the defective word line included in the memory bank is supplied in a first operation mode and generates the roll call data when an address corresponding to the defective bit line included in the memory bank is supplied in a second operation mode.

4. The apparatus as claimed in claim 3, wherein each of the plurality of roll call circuits outputs the roll call data to at least two corresponding data buses among the plurality of data buses.

5. An apparatus comprising:
a plurality of memory banks each including a plurality of memory cells, each of the plurality of memory banks is divided into a first area and a second area, and each of the plurality of memory banks includes a plurality of word lines and a plurality of bit lines for selecting the plurality of memory cells;
a plurality of redundant circuits each allocated to an associated one of the plurality of memory banks to replace a defective memory cell among the plurality of memory cells included in the associated memory bank, each of the plurality of redundant circuits includes:
a row redundant circuit that replaces a defective word line among the plurality of word lines included in the memory bank; and
a column redundant circuit that replaces a defective bit line among the plurality of bit lines included in the memory bank;
a plurality of roll call circuits allocated to an associated one of the plurality of memory banks to generate a roll call data when an address corresponding to the defective memory cell is supplied, each of the plurality of roll call circuits generates the roll call data when an address corresponding to the defective word line included in the memory bank is supplied in a first operation mode and generates the roll call data when an address corresponding to the defective bit line included in the memory bank is supplied in a second operation mode, each of the plurality of roll call circuits outputs a first roll call data to one of the two data buses when an address corresponding to the defective bit line included in the first area of the memory bank is supplied and outputs a second roll call data to the other one of the two data buses when an address corresponding to the defective bit line included in the second area of the associated memory bank is supplied in the second operation mode; and a plurality of data buses commonly allocated to the plurality of memory banks, wherein the plurality of roll call circuits output the roll call data to the plurality of data buses in parallel and wherein each of the plurality of roll call circuits outputs the roll call data to at least two corresponding data buses among the plurality of data buses.

6. An apparatus comprising:

a plurality of memory banks each including a plurality of memory cells, each of the plurality of memory banks includes a plurality of word lines and a plurality of bit lines for selecting the plurality of memory cells;

a plurality of redundant circuits each allocated to an associated one of the plurality of memory cell among the plurality of memory cells included in the associated memory bank, each of the plurality of redundant circuits includes:
  a row redundant circuit that replaces a defective word line among the plurality of word lines included in the memory bank; and
  a column redundant circuit that replaces a defective bit line among the plurality of bit lines included in the memory bank;

a plurality of roll call circuits allocated to an associated one of the plurality of memory banks to generate a roll call data when an address corresponding to the defective memory cell is supplied, each of the plurality of roll call circuits generates the roll call data when an address corresponding to the defective word line included in the memory bank is supplied in a first operation mode and generates the roll call data when an address corresponding to the defective bit line included in the memory bank is supplied in a second operation mode, wherein, in a third operation mode, each of the plurality of roll call circuits outputs a third roll call data to one of the two data buses when an address corresponding to the defective word line included in the associated memory bank is supplied and outputs a fourth roll call data to the other one of the two data buses when an address corresponding to the defective bit line included in the associated memory bank is supplied; and a plurality of data buses commonly allocated to the plurality of memory banks, wherein the plurality of roll call circuits output the roll call data to the plurality of data buses in parallel and wherein each of the plurality of roll call circuits outputs the roll call data to at least two corresponding data buses among the plurality of data buses.

7. An apparatus comprising:

a plurality of memory banks each including a plurality of memory cells;

a plurality of redundant circuits each allocated to an associated one of the plurality of memory banks to replace a defective memory cell among the plurality of memory cells included in the associated memory bank;

a plurality of roll call circuits allocated to an associated one of the plurality of memory banks to generate a roll call data when an address corresponding to the defective memory cell is supplied;

a plurality of data buses commonly allocated to the plurality of memory banks; and a plurality of parallel test circuits each allocated to an associated one of the plurality of memory banks to generate a test data by compressing data read from the associated memory bank, wherein the plurality of roll call circuits output the roll call data to the plurality of data buses in parallel and wherein each of the roll call circuits of the plurality of roll call circuits outputs the test data to any one of the plurality of data buses in a fourth operation mode.

* * * * *